United States Patent

Vinson et al.

(10) Patent No.: US 7,405,932 B2
(45) Date of Patent: Jul. 29, 2008

(54) SYSTEM AND METHOD FOR COOLING ELECTRONIC DEVICES

(75) Inventors: Wade Vinson, Magnolia, TX (US); Art Volkmann, Spring, TX (US); John Franz, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 417 days.

(21) Appl. No.: 10/894,215

(22) Filed: Jul. 19, 2004

(65) Prior Publication Data

US 2006/0012955 A1 Jan. 19, 2006

(51) Int. Cl.
*G06F 1/20* (2006.01)
(52) U.S. Cl. .................................... 361/695; 165/80.3
(58) Field of Classification Search ................ 361/695; 165/80.3
See application file for complete search history.

(56) References Cited

U.S. PATENT DOCUMENTS

| 5,309,983 | A | * | 5/1994 | Bailey | 165/80.3 |
| 5,377,745 | A | * | 1/1995 | Hsieh | 165/80.3 |
| 5,787,971 | A | * | 8/1998 | Dodson | 165/121 |
| 5,940,269 | A | * | 8/1999 | Ko et al. | 361/697 |
| 6,097,601 | A | * | 8/2000 | Lee | 361/704 |
| 6,125,921 | A | * | 10/2000 | Kuo | 165/80.3 |
| 6,415,852 | B1 | | 7/2002 | Lo | |
| 6,496,368 | B2 | | 12/2002 | Jui-Yuan | |
| 6,512,673 | B1 | * | 1/2003 | Wiley | 361/695 |
| 6,639,800 | B1 | * | 10/2003 | Eyman et al. | 361/704 |
| 6,661,660 | B2 | | 12/2003 | Prasher et al. | |
| 6,778,390 | B2 | * | 8/2004 | Michael | 361/695 |
| 7,071,587 | B2 | * | 7/2006 | Lopatinsky et al. | 310/64 |
| 2002/0029868 | A1 | * | 3/2002 | Katsui | 165/80.3 |

* cited by examiner

*Primary Examiner*—Lisa Lea-Edmonds

(57) ABSTRACT

In accordance with certain embodiments, a computer system having an electronic component, a heat sink having a contact surface disposed against the electronic component, and at least one blower embedded within fins of the heat sink.

36 Claims, 7 Drawing Sheets

SYSTEM AND METHOD FOR COOLING ELECTRONIC DEVICES

BACKGROUND OF THE RELATED ART

This section is intended to introduce the reader to various aspects of art, which may be related to various aspects of the present technique that are described and/or claimed below. This discussion is believed to be helpful in providing the reader with background information to facilitate a better understanding of the various aspects of the present invention. Accordingly, it should be understood that these statements are to be read in this light, and not as admissions of prior art.

Fans and heat sinks are often mounted in electronic devices to cool the various internal components. For example, computers often have a heat sink and fan mounted to the processor. Unfortunately, these heat sinks only accommodate a single fan above the processor. In addition, fans are often mounted within the computer housing, such as along the walls or within ductwork. The wall mounted fans circulate air through the computer housing, yet airflows are not directed onto specific components. Thus, wall mounted fans are not particularly efficient at cooling specific components. The duct mounted fans are more efficient at cooling specific components, because the ducts direct the airflows onto the components. However, space limitations often preclude the use of ducts.

In computers, such as rack mount servers, fans are typically axial fans having a relatively small diameter, which limits their airflow potential. To compensate for this small diameter, axial fans are operated at a high rotational speed, e.g., 15,000 RPM, to develop the desired airflow. Unfortunately, this high rotational speed creates significant noise. In certain applications, these axial fans may include counter rotating impellers to increase the airflow. As a result, the counter rotating impellers double the number of motors, the power requirement, and the noise output of the axial fan. In servers and other applications, redundancies are desirable to ensure continuous airflow in the event that one of the fans malfunctions or fails to operate. A typical server often has between ten and twenty axial fans and, thus, a rack system can have over one hundred axial fans. Thus, the noise and power requirements of these fans can be quite significant.

SUMMARY

In accordance with certain embodiments, a computer system having an electronic component, a heat sink having a contact surface disposed against the electronic component, and at least one blower embedded within fins of the heat sink.

BRIEF DESCRIPTION OF THE DRAWINGS

Advantages of one or more disclosed embodiments may become apparent upon reading the following detailed description and upon reference to the drawings in which.

DETAILED DESCRIPTION

One or more specific embodiments of the present technique will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
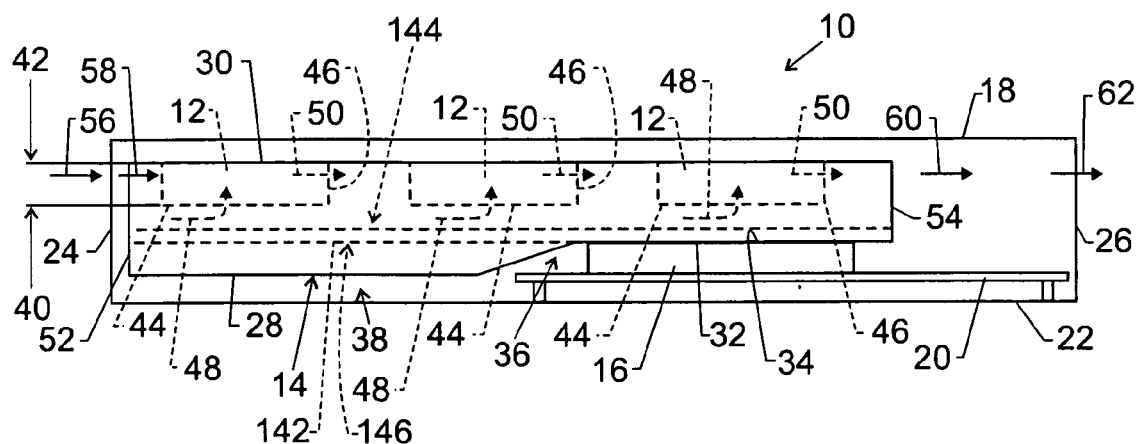
FIG. 1 is a side view of an electronic device having a plurality of blowers embedded within a heat sink mounted over a component in accordance with embodiments of the present invention.

FIG. 1 is a side view of an electronic device 10 having a plurality of blowers 12 embedded within a heat sink 14 mounted over a component 16 in accordance with embodiments of the present invention. In other words, the inlets and the outlets of the blowers 12 are both positioned to flow air through the heat sink 14, thereby doubling the cooling capacity of the blowers 12. As discussed in detail below, the heat sink 14 has a relatively larger cooling capacity attributed to increased surface area and volume of the heat sink 14 and, also, attributed to forced airflow through the heat sink 14 at inlet and outlet locations of the blowers 12. For example, embodiments of the heat sink 14 are extended laterally away from the component 16, such that the heat sink 14 is both over and next to the component 16. In this manner, the lateral extension can increase the cooling capacity of the heat sink 14 by double, triple, or another factor. By further example, embodiments of the heat sink 14 have multiple levels of convective members (e.g., pins or fins), which are positioned in the pathways of both the inlet and outlet airflows of the blowers 12. Thus, each of the blowers 12 provides double the cooling capacity, because some of the convective members are cooled by pulling air and other convective members are cooled by pushing air. In certain embodiments, the blowers 12 and the heat sink 12 include other features to increase the cooling capacity of the heat sink 14.

As illustrated in FIG. 1, the electronic device 10 comprises a housing 18, a circuit board 20 mounted at a base 22 of the housing 18, an air inlet 24 at the left side of the housing 18, and an air exhaust 26 at the right side of the housing 18. The electronic device 10 also can include a variety of other electronic devices and components, such as a processor, random access memory, a hard drive, a graphics processing module, an audio processing module, removable media drives, input/output ports, and so forth. In certain embodiments, the electronic device 10 is a computer system, such as a desktop computer, a laptop computer, a tablet personal computer, a personal digital assistant, or a rack mount computer. By further example, the electronic device 10 may be a server, such as a floor mount or a rack mount server.

The illustrated heat sink 14 is adapted to facilitate heat transfer by a variety of techniques, including thermal conduction and convection. For example, the heat sink 14 is formed of a thermally conductive material, which can include aluminum, copper, and so forth. In addition, the heat sink 14 includes a central conductive member 142 and a plurality of convective members, such as upper and lower fins 144 and 146, which are positioned between a bottom side 28 and a top side 30 of the heat sink 14. These upper and lower fins 144 and 146 facilitate convective heat transfer away from the central conductive member 142. In some embodiments, these convective members all extend upwardly from a conductive base (not shown) disposed along the bottom side 28 of the heat sink 14.

The heat sink 14 also has a unique configuration to increase the surface area for convective heat transfer, while also reducing space consumption of multiple blowers 12. As illustrated, the heat sink 14 has a component mounting surface 32, which contacts a top surface 34 of the component 16. In certain embodiments, a thermal interface material is disposed between the component mounting surface 32 and the top surface 34 to increase the thermal conductivity between the heat sink 14 and the component 16. By further illustration, the component mounting surface 32 is disposed on a right or top mount portion 36 of the heat sink 14, such that the heat sink 14 extends across and away from the component 16 to a left or lateral extension portion 38. In other words, the heat sink 14 is positioned both above and laterally adjacent the component 16, as illustrated by the portions 36 and 38, respectively.

These top mount and lateral extension portions 36 and 38 significantly increases the cooling capacity of the heat sink 14, because the heat sink 14 has a greater volume for thermal conduction and a greater surface area for thermal convection. In operation, the heat sink 14 dissipates heat generated by the component 16 by transferring the heat along the length of the heat sink 14, such that convective members (e.g., upper and lower fins 144 and 146) on portions 36 and 38 convectively transfer the heat away from the heat sink 14. For example, the lateral extension portion 38 enables the illustrated heat sink 14 to have two, three, or another factor times the number of convective members as compared to a simple top mount heat sink. As a result, the heat sink 14 can have two, three, or another factor of greater convective cooling as compared to the simple top mount heat sink.

In addition to the foregoing features, the illustrated heat sink 14 supports the three blowers 12 between first and second levels 40 and 42 of the heat sink 14, such that the blowers 12 do not consume additional space outside the boundaries of the heat sink 14. In alternative embodiments, the heat sink 14 may include a single blower 12 or, alternatively, two, four, or more blowers 12. Referring to the illustrated embodiment, the first level 40 is disposed between the bottom and top sides 28 and 30, while the second level 42 is at the top side 30. However, alternative embodiments of the heat sink 14 support the blowers 12 at a central location between the bottom and top sides 28 and 30, or partially extending outside the bottom and/or top sides 28 and 30. Although not illustrated in FIG. 1, the heat sink 14 includes one or more air passages or channels extending along the heat sink 14, such that the blowers 12 can force air lengthwise along the heat sink 14. For example, as discussed in further detail below with reference to FIGS. 4-6, passages or channels 145 and 147 are formed between pairs of adjacent upper fins 144 and between pairs of adjacent lower fins 146 along the length of the heat sink 14.

In operation, the air passages enable the plurality of blowers 12 to create an airflow along the length of the heat sink 14 from the lateral extension portion 38 to the top mount portion 36, thereby forcing convective heat transfer away from the heat sink 14. If any one of the blowers 12 fails or malfunctions, the remaining blowers 12 continue to create this cooling airflow to ensure that the component 16 is sufficiently cooled. In the illustrated embodiment, the blowers 12 include an open base 44 and an open side 46, such that the blowers 12 pull air in through the open base 44 and force the air out through the open side 46, as indicated by dashed arrows 48 and 50, respectively. Thus, the blowers 12 pull air up through a portion of the upper fins 144 above the conductive member 142, and push the air out through a higher portion of the upper fins 144 above the conductive member 142. In operation, these blowers 12 draw air into the housing 18 through the air inlet 24, into a first end 52 of the heat sink 14, through the blowers 12, out of a second end 54 of the heat sink 14, and out of the housing 18 through the air exhaust 26, as indicated by arrows 56, 58, 48 and 50, 60, and 62, respectively. An embodiment of these blowers 12 is illustrated below with reference to FIG. 6.

Figure 2:
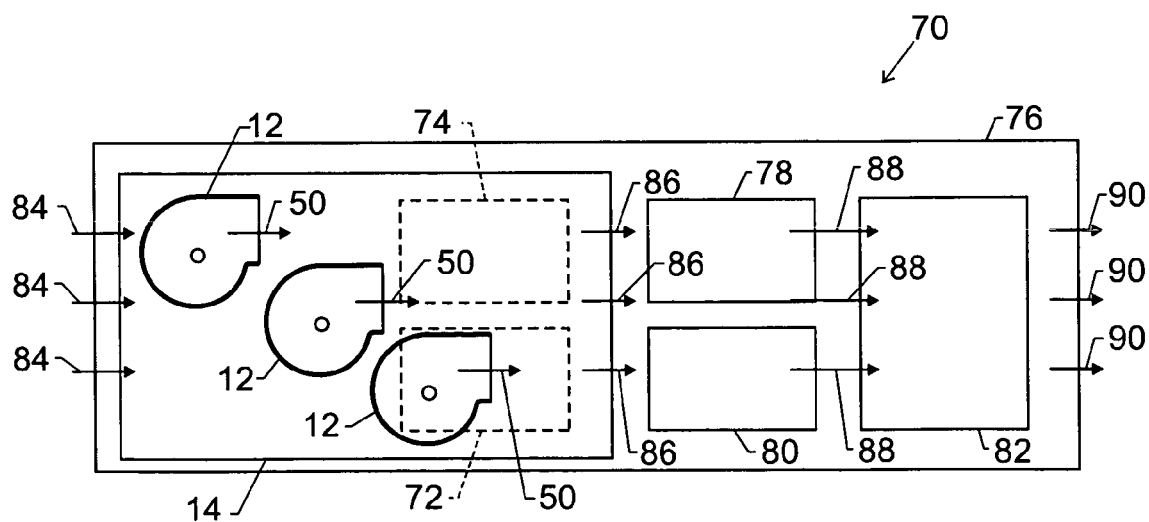
FIG. 2 is a top view of an electronic device having a plurality of blowers embedded within a heat sink mounted over multiple components in accordance with embodiments of the present invention.

FIG. 2 is a top view of an electronic device 70 having the plurality of blowers 12 embedded within the heat sink 14 of FIG. 1, wherein the heat sink 14 is mounted over multiple components 72 and 74 within a housing 76 in accordance with embodiments of the present invention. The illustrated electronic device 70 also includes a plurality of components 78, 80, and 82 disposed next to the heat sink 14 and blowers 12. These components 72, 74, 78, 80, and 82 can include processors, random access memory, hard drives, audio processing modules, video processing modules, and so forth. As indicated by arrows 84, 50, 86, 88, and 90, the blowers 12 force air to flow into the housing 76, through the heat sink 14 mounted over the components 72 and 74, out of the heat sink 14, over/through the components 78, 80, and 82, and out of the housing 76. Thus, in the illustrated embodiment, the blowers 12 facilitate convective cooling of the components 72 and 74 that interface the heat sink 14, while also directing the air to cool other components 78, 80, and 82 within the housing 76. As discussed above, the heat sink 14 includes a plurality of passages (not shown), such as gaps between the upper and lower fins 144 and 146 (not shown), which facilitate the air flow illustrated by arrows 84, 50, 86, 88, and 90. In other words, the air passages in the heat sink 14 channel or duct the airflow provided by the blowers 12 embedded in the heat sink 14, such that airflow is directed over the separate components 78, 80, and 82.

Figure 3:
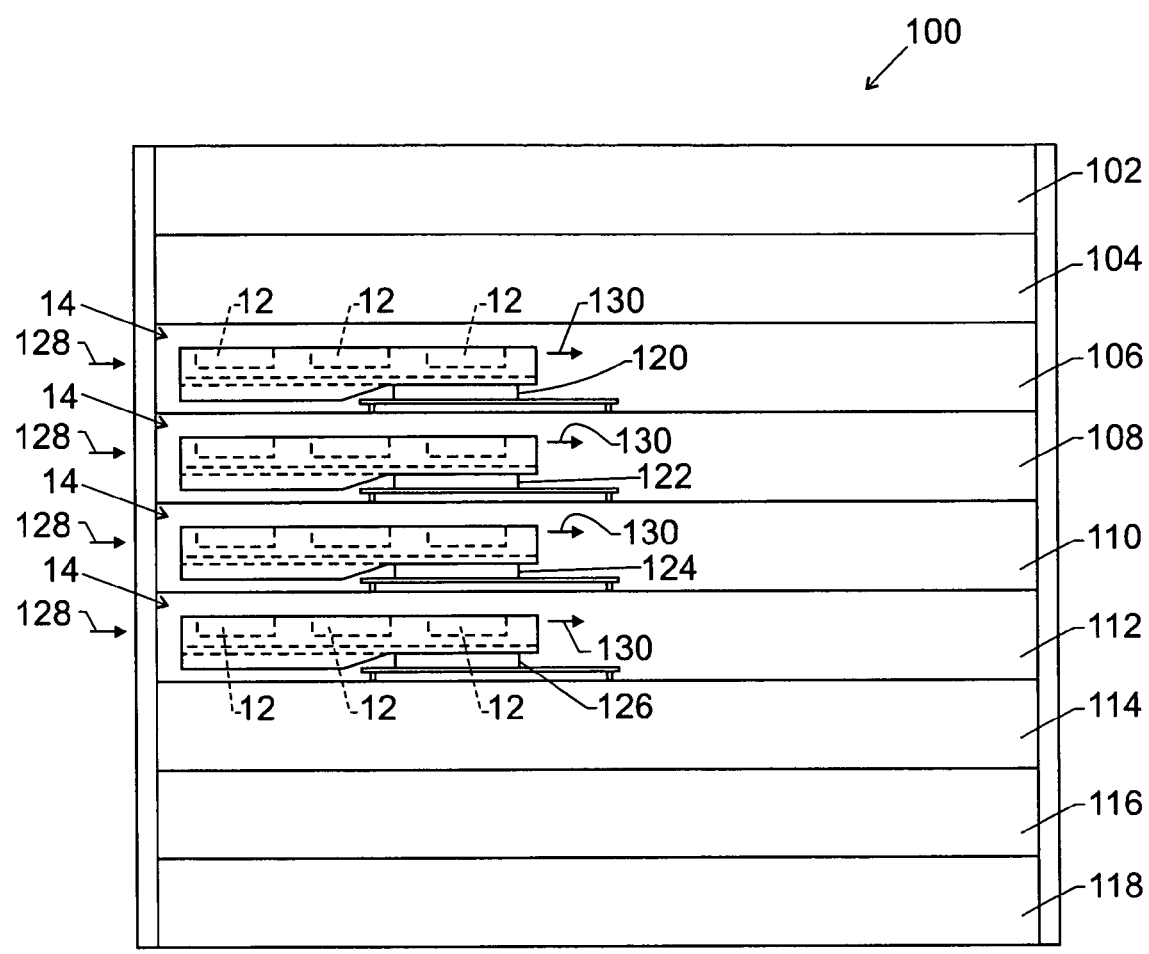
FIG. 3 is a side view of a rack system having a plurality of rack devices, each including a plurality of blowers embedded within a heat sink mounted to a component in accordance with embodiments of the present invention.

FIG. 3 is a side view of a rack system 100 having a plurality of rack devices 102 through 118, wherein the rack devices 106 through 112 include the plurality of blowers 12 embedded within the heat sink 14 of FIG. 1 in accordance with embodiments of the present invention. Again, the inlets and outlets of these blowers 12 are oriented to respectively pull and push air through adjacent portions of the heat sink 14. In certain embodiments, these rack devices 102 through 118 include servers, storage media enclosures, switches, keyboard, monitors, power distribution, and so forth. The illustrated heat sinks 14 are mounted over components 120, 122, 124, and 126 within each of the respective rack devices 106, 108, 110, and 112. As discussed above, these components 120, 122, 124, and 126 can include processors, random access memory, hard drives, graphics modules, audio modules, and other electronic devices. In operation, the illustrated blowers 12 force air through the heat sinks 14 disposed within the rack devices 106, 108, 110, and 112, as indicated by the airflow arrows 128 and 130. This airflow 128 and 130 forces convective heat transfer away from the heat sinks 14, thereby dissipating heat generated by the components 120, 122, 124, and 126.

Again, referring to FIG. 3 and generally to FIGS. 1 and 2, the elongated structure of the heat sink 14, which includes both top mount and lateral extension portions 36 and 38, increases the volume and surface area of the heat sink 14. The increased volume significantly increases heat transfer by thermal conduction through the heat sink 14 away from the components 120, 122, 124, and 126. The increased surface area significantly increases heat transfer by thermal convection away from the heat sink 14 and, thus, away from the components 120, 122, 124, and 126. Moreover, the increased volume, and particularly the lateral extension portion 38, of the heat sink 14 facilitates the redundant configuration of blowers 12 within the boundaries of the heat sink 14. This is particularly beneficial for tight rack spaces, such as 1 U or smaller rack spaces.

Also, the use of blowers 12 rather than axial fans provides relatively greater air flow rates through the heat sinks 14, thereby improving the convective heat transfer away from the heat sinks 14. As discussed above, the blowers 12 have a greater degree of cooling capacity (e.g., double), which is at least partially attributed to the dual-action pushing/pulling of air through the upper fins 144. Moreover, the use of blowers 12 rather than axial fans can significantly decrease the noise levels within the individual rack devices 106 through 112, and within the entire rack system 100. In alternative embodiments, axial fans may be disposed within or adjacent the heat sink 14, such that air is forced through the heat sink 14. For example, one or more axial fans can be positioned at the ends of the heat sink 14, such that each of the axial fans either pushes or pulls air through the heat sink 14.

Figure 4:
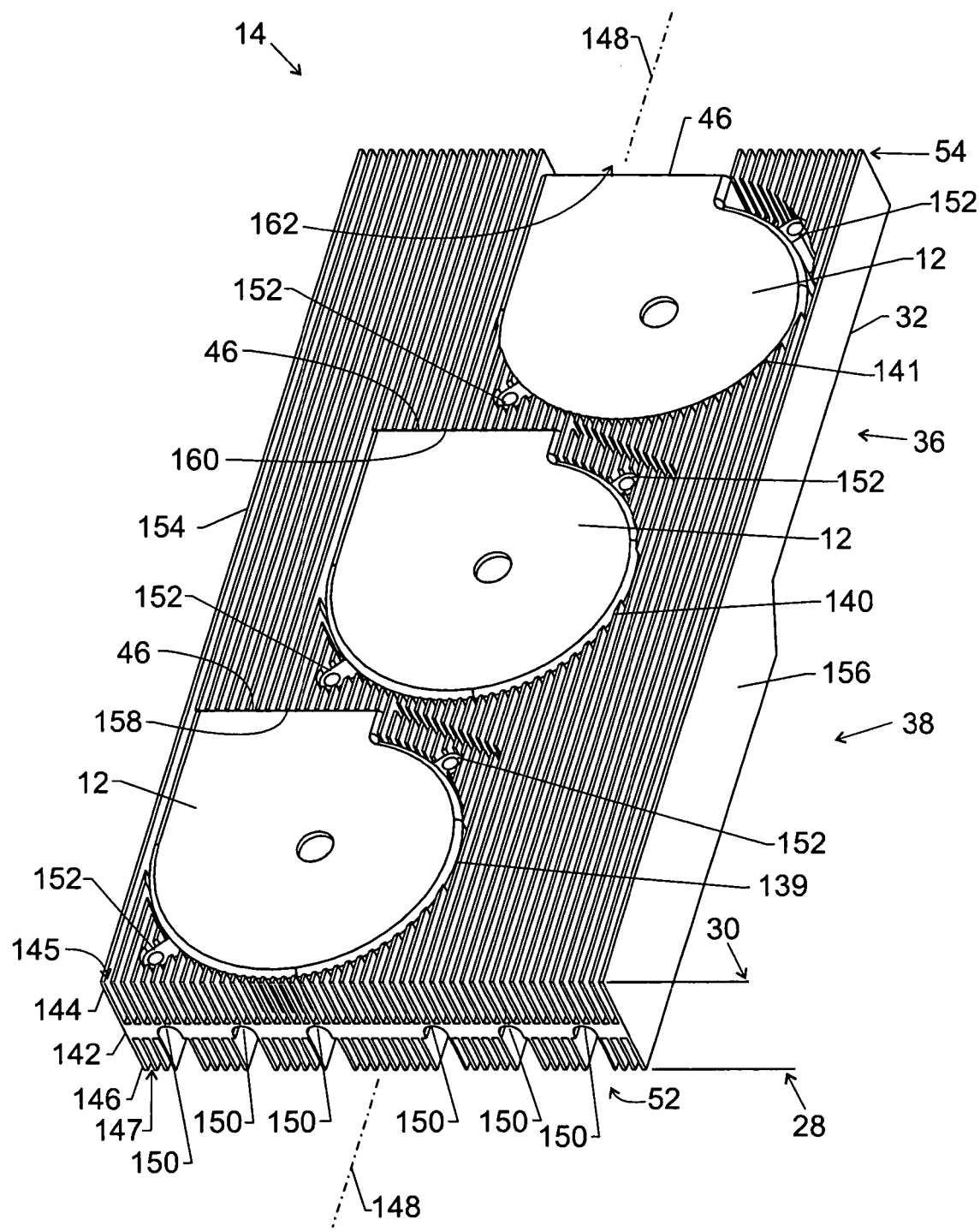
FIG. 4 is a top perspective view of a heat sink having a plurality of blowers mounted within blower receptacles in fins of the heat sink in accordance with embodiments of the present invention.

FIG. 4 is a top perspective view of the heat sink 14 of FIG. 1 having the plurality of blowers 12 mounted in blower receptacles 139, 140, and 141 within fins of the heat sink 14 in accordance with embodiments of the present invention. In the illustrated embodiment, the heat sink 14 has the central conductive member 142, upper fins 144 extending upwardly from the central conductive member 142 to the top side 30, and lower fins 146 extending downwardly from the central conductive member 142 to the bottom side 28. These upper and lower fins 144 and 146 are generally parallel with one another and with a longitudinal centerline 148 of the heat sink 14. In this manner, the upper and lower fins 144 and 146 channel, duct, or generally direct the airflow through intermediate air passages or channels 145 and 147, respectively, along the length of the heat sink 14 between the first and second ends 52 and 54.

Although not shown in FIG. 4, the central conductive member 142 extends from the first end 52 to the second end 54 of the heat sink 14. In certain embodiments, the central conductive member 142 includes additional heat transfer mechanisms, such as circulating vapor chambers or heat pipes disposed within lower receptacles 150. For example, the central conductive member 142 can include one or more closed passages containing an amount of fluid, such that heat is absorbed at one end by vaporization of the fluid and the heat is released at the other end by condensation of the vapor. The central conductive member 142 also includes the component mounting surface 32 below the right or top mount portion 36 of the heat sink 14. As discussed above with reference to FIGS. 1-2, the component mounting surface 32 can be disposed against one or more components, such as a plurality of processors.

Turning to the arrangement of the upper and lower fins 144 and 146 in FIG. 4, the illustrated upper fins 144 extend continuously along the length of the heat sink 14. As discussed in detail below, alternative embodiments have breaks and/or stepped configurations of the upper fins 144. The illustrated lower fins 146 are positioned in the left or lateral extension portion 38 of the heat sink 14, but these lower fins 146 do not extend into the right or top mount portion 36. One benefit of this configuration is that the lower fins 146 can act as a base support, such that the component mounting surface 32 is raised to the level of a component (e.g., component 16 of FIG. 1) being cooled by the heat sink 14. These lower fins 146 can also contact the housing, e.g., computer housing, to facilitate heat spreading into the housing. In addition, the lower fins 146 provide additional convective cooling below the conductive member 142 and, also, below the interface between the component mounting surface 32 and the component being cooled (e.g., component 16 of FIG. 1). For example, one or more additional blowers 12 may be disposed within the lower fins 146 in alternative embodiments. Furthermore, alternate embodiments of the heat sink 14 can extend these lower fins 146 into the right or top mount portion 36 around the component mounting surface 32.

In the illustrated embodiment of FIG. 4, the conductive member 142 does not include openings between the upper and lower fins 144 and 146. Accordingly, the blowers 12 function to pull air from the upper fins 144 on one side and, subsequently, push the airflow out through the upper fins on the opposite side. However, alternative embodiments of the conductive member 142 can include openings, such as slots or holes, to enable airflow between the upper and lower fins 144 and 146. For example, the conductive member 142 can include openings upstream from each of the blowers 12, such that the blowers 12 pull an amount of air from each of the upper and lower fins 144 and 146. In other embodiments, one or more axial fans may be positioned at one or both ends of the heat sink 14, such that air is forced through both the upper and lower fins 144 and 146. Again, the passages 145 and 147 between the upper and lower fins 144 and 146 guide the airflow along the length of the heat sink 14.

In the upper fins 144 of FIG. 4, the blowers 12 are mounted within the blower receptacles 139, 140, and 141 via fasteners 152. In certain embodiments, these fasteners 152 may include threaded fasteners, such as thumb screws, nuts, or bolts. Alternatively, the fasteners 152 can include latches, adhesives, rivets, quick release handles, hot-plug connectors, and so forth. As illustrated with reference to FIGS. 4 and 5, the blower receptacles 139, 140, and 141 are staggered from a first side 154 to a second side 156 along the length of the heat sink 14 from the first end 52 to the second end 54. In the illustrated configuration, the open sides 46 of the blowers 12 are directed into different side portions 158, 160, and 162 of the upper fins 144, such that some overlap exists between the staggered blowers 12. However, alternative embodiments of the heat sink 14 may increase or decrease (or eliminate) this overlap between the staggered blowers 12. However, a degree of overlap between the staggered blowers 12 better accommodates a potential failure of one of the blowers 12. For example, if the intermediate blower 12 fails to operate, then the blowers 12 near the first and second ends 52 and 54 substantially maintain the airflow through the upper fins 144.

Figure 5:
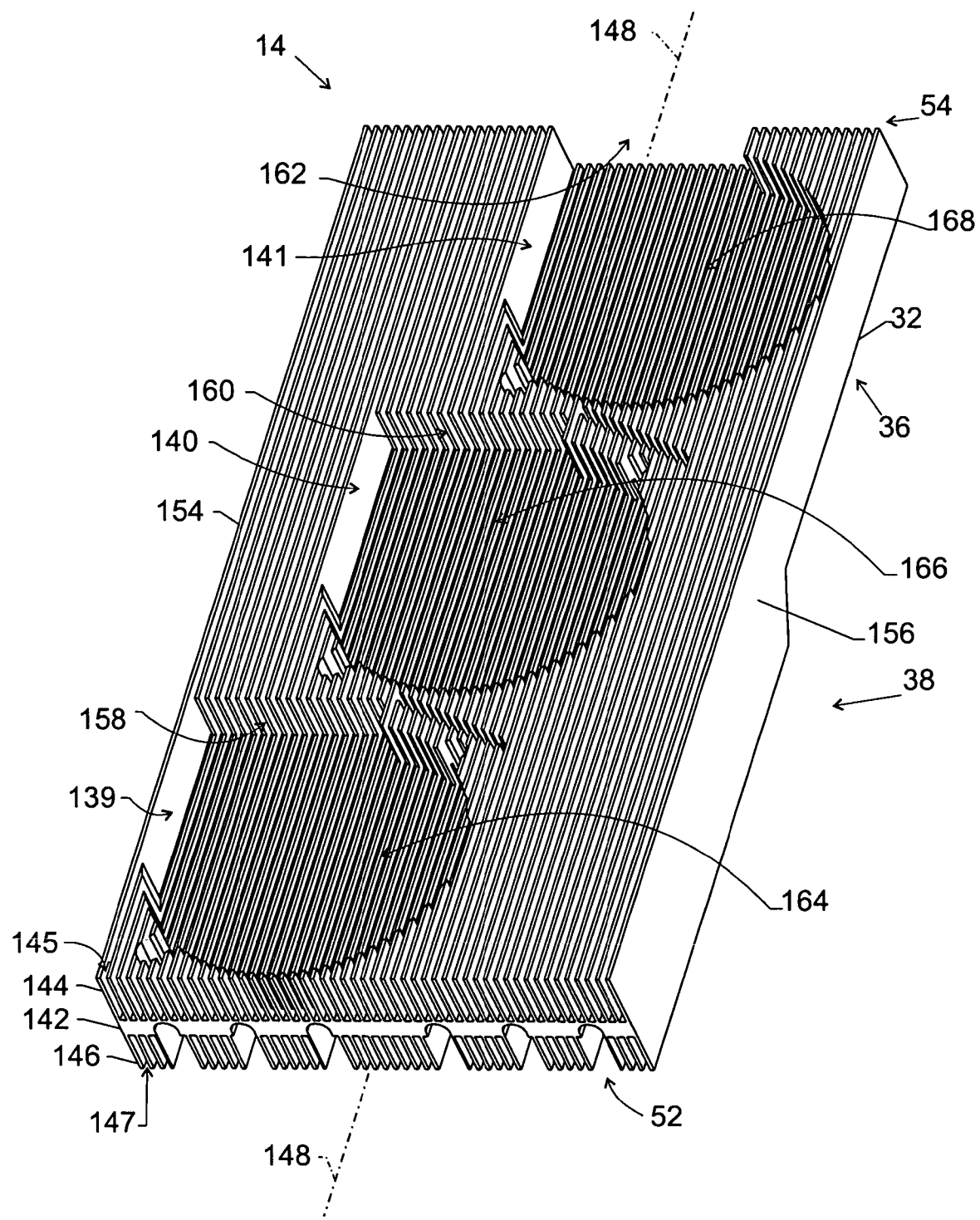
FIG. 5 is a top perspective view of the heat sink of FIG. 4 illustrating the blower receptacles in the fins of the heat sink in accordance with embodiments of the present invention.

As further illustrated in FIG. 5, the blower receptacles 139, 140, and 141 include different bottom portions 164, 166, and 168 of the upper fins 144. When the blowers 12 are disposed within these blower receptacles 139, 140, and 141, the open base 44 of the blowers 12 illustrated in FIGS. 1 and 6 faces these bottom portions 164, 166, and 168. In operation, the blowers 12 force air up through the bottom portions 164, 166, and 168 and, subsequently, out through the different side portions 158, 160, and 162 of the upper fins 144. In other words, the blowers 12 draw air in from the upper fins 144 at a first level corresponding to the bottom fin portions 164, 166 and 168, and then eject the air into the upper fins 144 at a second level corresponding to the side fin portions 158, 160, and 162. In this manner, the blowers 12 are embedded within the upper fins 144, thereby eliminating the typical space consumption of independently mounted fans. In addition, as mentioned above, the upper fins 144 extending around the blowers 12 not only facilitate convective heat transfer, but the upper fins 144 channel or direct the air flow through intermediate air passages 145 along the length of the heat sink 14. If desired, the upper fins 144 also channel or direct the airflow onto electronic components further downstream from the second end 54 of the heat sink 14.

Figure 6:
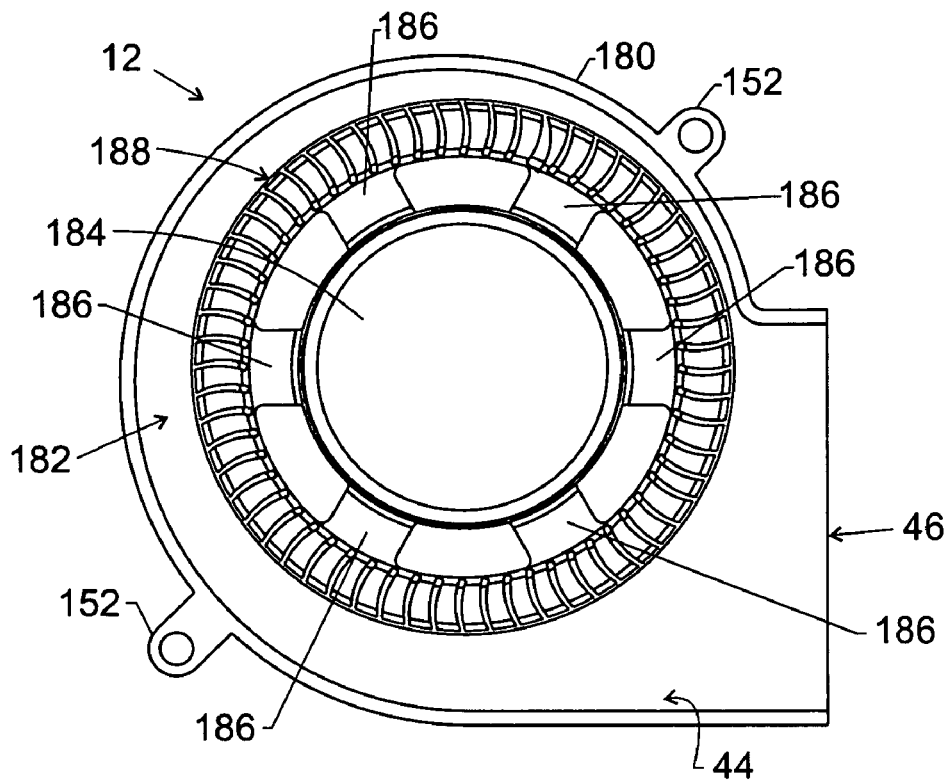
FIG. 6 is a bottom view of a blower in accordance with embodiments of the present invention.

FIG. 6 is a bottom view of the blower 12 in accordance with embodiments of the present invention. As illustrated, the blower 12 includes a housing 180 having the open base 44 and the open side 46, the fasteners 152 disposed on opposite sides of the housing 180, and a motorized fan assembly 182 disposed within the housing 180 between the open base 44 and the open side 46. The motorized fan assembly 182 includes a motor 184, a plurality of spokes or radial members 186 extending outwardly from the motor 184, and a plurality of circumferentially arranged fan blades 188 coupled to the radial members 186. These fan blades 188 rotate circumferentially around the motor 184, such that the motorized fan assembly 182 pulls air in from the open base 44 and forces the air out through the open side 46. If a greater flow rate is desired, then the blower 12 can have wider fan blades 188 and/or a larger circumferential diameter of the plurality of fan blades 188 around the motor 184. Moreover, other blowers and fan assemblies may be employed in alternative embodiments.

Figure 7:
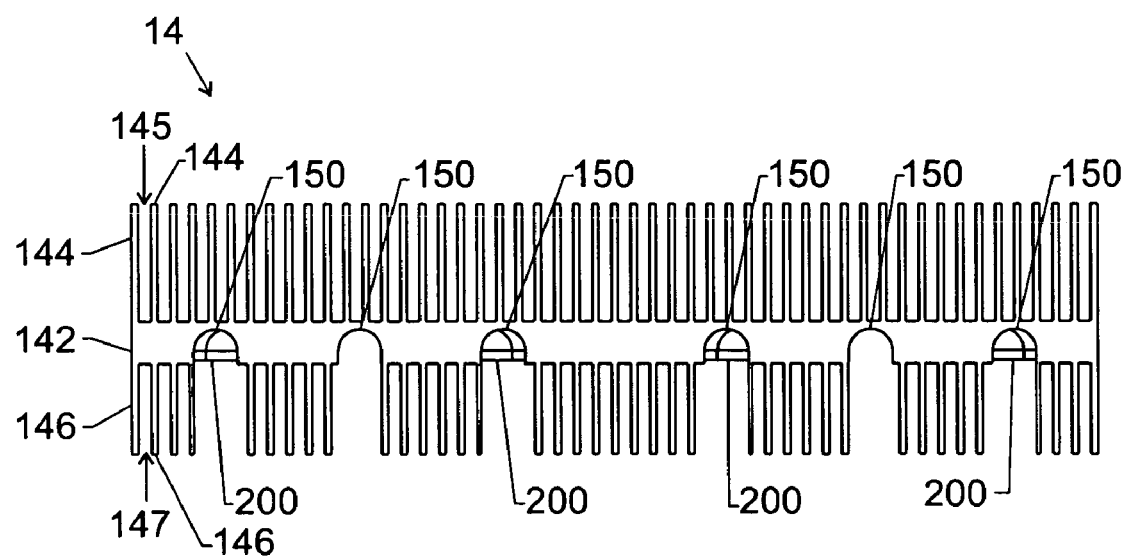
FIG. 7 is an end view of the heat sink of FIGS. 4 and 5 in accordance with embodiments of the present invention.

FIG. 7 is an end view of the heat sink 14 of FIGS. 4 and 5 in accordance with embodiments of the present invention. In this exemplary embodiment, the heat sink 14 includes heat pipes 200 in some of the lower receptacles 150. The illustrated heat pipes 200 extend from the first end 52 to the second end 54 of the heat sink 14, such that the heat pipes 200 transfer heat from the top mount portion 36 to the lateral extension portion 38. In other words, the heat pipes 200 supplement the thermal conduction from the second end 54 to the first end 52, thereby increasing the heat distribution throughout the heat sink 14. The upper and lower fins 144 and 146, in turn, convectively dissipate this heat with the aid of the blowers 12.

Figure 8:
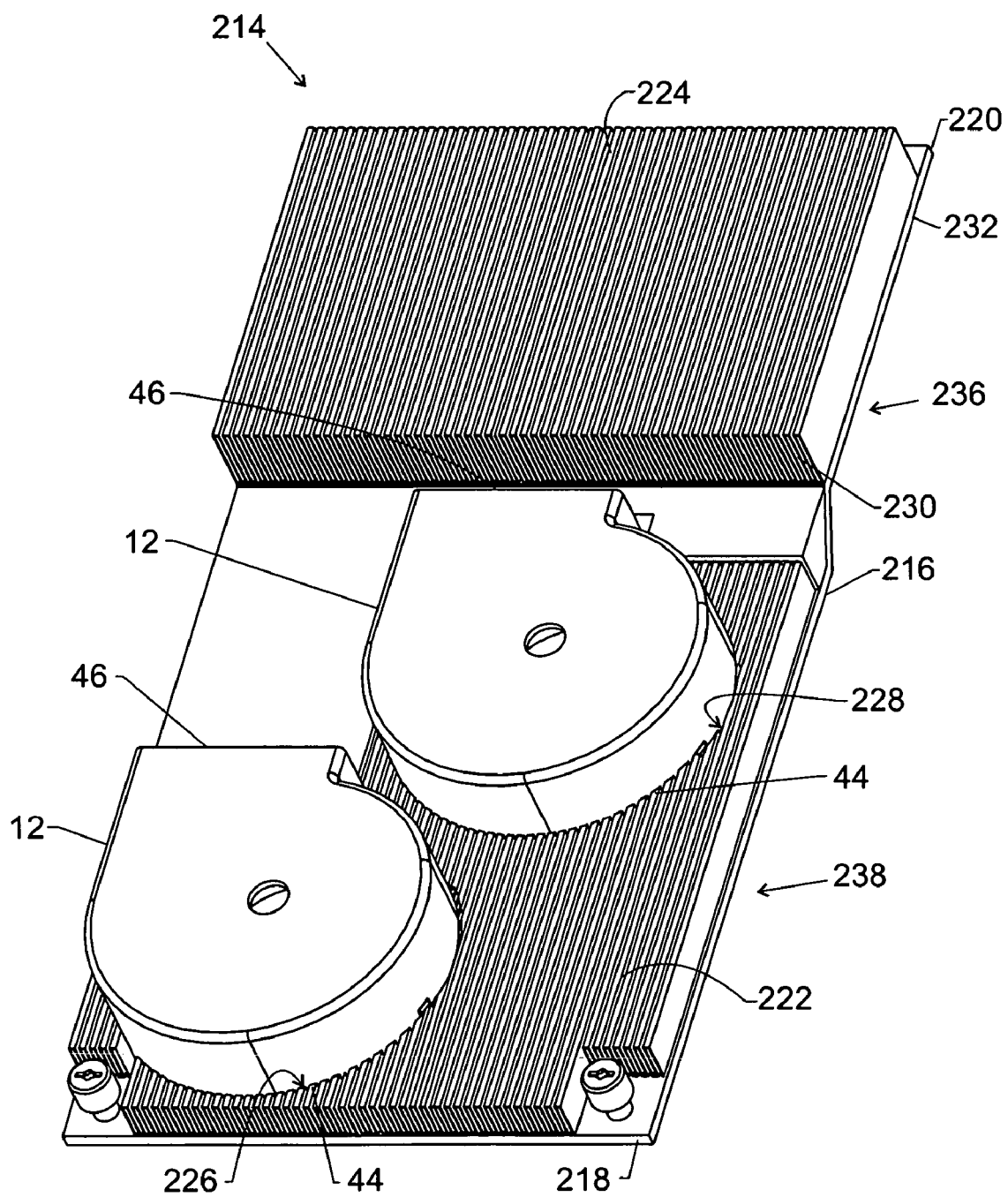
FIG. 8 is a top perspective view of an alternative heat sink having a plurality of blowers mounted onto fins of the heat sink in accordance with embodiments of the present invention.

FIG. 8 is a top perspective view of an alternative heat sink 214 having a pair of blowers 12 mounted onto fins of the heat sink 214 in accordance with embodiments of the present invention. Alternatively, the heat sink 214 may include a single blower, three blowers, or other numbers and configurations of blowing devices. In the illustrated embodiment, the heat sink 214 has a stepped conductive base 216, which includes a first member 218 and a second member 220 positioned higher than the first member 218. The first member 218 has a plurality of first fins 222, and the second member 220 has a plurality of second fins 224. Thus, the top of the second fins 224 is vertically offset or stepped up from the top of the first fins 222. In the illustrated embodiment, the first fins 222 extend outwardly from the first member 218 to approximately the same level as the second member 220.

In this stepped or multi-leveled configuration of the first and second fins 222 and 224, the blowers 12 are disposed in a staggered configuration on the first fins 222. Thus, the open bottoms 44 of the blowers 12 face top portion 226 and 228 of the first fins 222, such that the blowers 12 draw air up from the first fins 222. In turn, the open sides 46 of the blowers 12 face a side portion 230 of the second fins 224, such that the blowers 12 eject air into the second fins 224. Again, the blowers 12 are positioned substantially between the upper and lower boundaries of the heat sink 12, such that the blowers 12 do not consume additional space. In this manner, the heat sink 214 and blowers 12 provide a stepped and staggered flow configuration.

In alternative embodiments of the heat sink 214, the first fins 222 may extend to one or more heights different from that illustrated in FIG. 8. For example, the first fins 222 may extend to a height above or below the height of the second member 220 or, alternatively, to a height above, below, or substantially equal with the height of the second fins 224. By further example, the first fins 222 may include blower receptacles, such as those described above with reference to FIGS. 4 and 5. Thus, the first and second fins 222 and 224 may form substantially continuous fins with integral blower receptacles, such that the fins define air passages or channels between opposite ends of the heat sink 214.

In addition, the heat sink 214 includes a component mounting surface 232 on the bottom of the second member 220. Similar to the heat sink 12, the illustrated heat sink 214 has a top mount portion 236 disposed over the component mounting surface 232 and, also, a lateral extension portion 238 that is laterally next to and lower than the component mounting surface 232. Thus, the heat sink 214 extends across and away from a component (not shown) interfacing the component mounting surface 232. These top mount and lateral extension portions 236 and 238 significantly increases the cooling capacity of the heat sink 214, because the heat sink 214 has a greater volume for thermal conduction and a greater surface area for thermal convection. In operation, the heat sink 214 dissipates heat generated by the component (not shown) by transferring the heat along the length of the stepped conductive base 216, such that the first and second fins 222 and 224 convectively transfer the heat away from the heat sink 214. In addition, certain embodiments of the stepped conductive base 216 include one or more circulating vapor chambers, which supplement the conductive heat transfer of the stepped conductive base 216.

Figure 9:
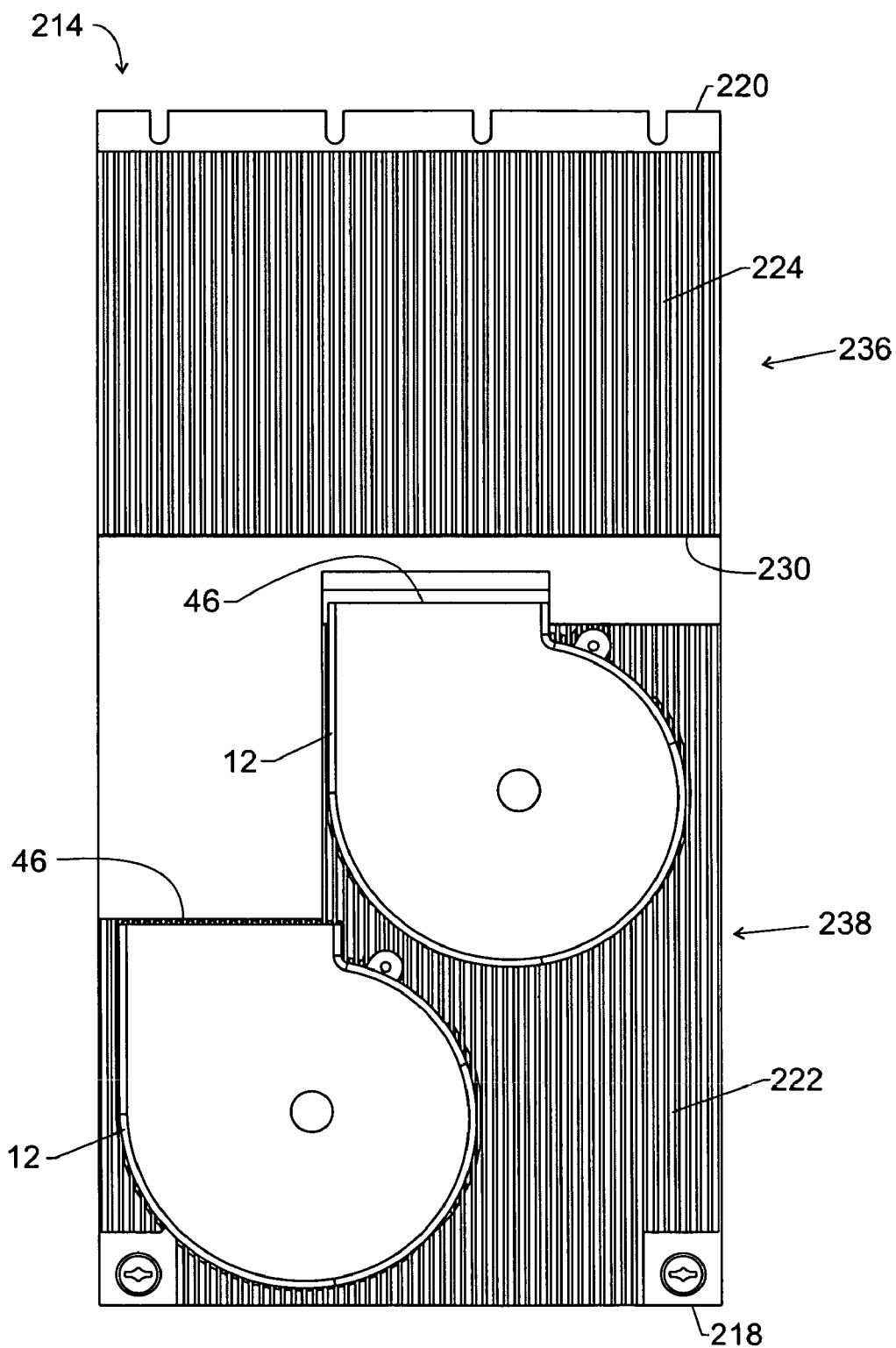
FIG. 9 is a top view of the heat sink of FIG. 8 in accordance with embodiments of the present invention.

FIG. 9 is a top view of the heat sink 214 of FIG. 8 in accordance with embodiments of the present invention. As illustrated in FIG. 9, the blowers 12 are staggered along the first fins 222 of the lateral extension portion 238, such that the different blowers 12 pass air through different rows of the first and second fins 222 and 224. However, alternative embodiments of the heat sink 214 may provide some overlap between these different blowers 21. In addition, alternative embodiments may include additional blowers 12 to increase the airflow through the heat sink 214.

While the technique may be susceptible to various modifications and alternative forms, specific embodiments have been shown by way of example in the drawings and will be described in detail herein. However, it should be understood that the technique is not intended to be limited to the particular forms disclosed. Rather, the technique is to cover all modifications, equivalents and alternatives falling within the spirit and scope of the technique as defined by the following appended claims.

What is claimed is:

1. A computer system, comprising:
   an electronic component;
   a heat sink having a contact surface disposed against the electronic component; and
   at least one blower embedded within fins of the heat sink, wherein the at least one blower is configured to intake air in a first direction and output air in a second direction generally transverse to the first direction.

2. The computer system of claim 1, wherein the electronic component comprises at least one processor.

3. The computer system of claim 1, wherein the fins comprise first fins extending to a first level and second fins extending to a second level, the second level being relatively higher than the first level.

4. The computer system of claim 3, wherein the at least one blower is disposed on the first fins.

5. The computer system of claim 4, wherein the fins comprise at least one blower receptacle having the first fins at a base of the blower receptacle.

6. The computer system of claim 5, wherein the second fins are disposed around sides of the at least one blower.

7. The computer system of claim 1, wherein the heat sink comprises an elongated structure having a first member disposed at a first tier and a second member disposed at a second tier, the second tier being relatively higher than the first tier, wherein the fins are disposed on the first and second members.

8. The computer system of claim 1, wherein the fins are disposed on opposite faces of an elongated member, the contact surface being disposed on one of the faces adjacent the fins.

9. The computer system of claim 1, wherein the heat sink comprises at least one chamber having a fluid that vaporizes to absorb heat at one region and that condenses to release heat at another region away from the first region.

10. The computer system of claim 1, wherein the heat sink comprises a top mount portion disposed over the electronic component and a lateral extension portion disposed laterally next to the electronic component.

11. The computer system of claim 1, wherein the at least one blower comprise a housing having a base opening and a side opening, the base opening being mounted to the fins at a first level and the side opening being directed toward fins at a second level, wherein the second level is relatively higher than the first level.

12. The computer system of claim 1, wherein the at least one blower comprises an inlet facing a first portion of the fins and an outlet facing a second portion of the fins.

13. The computer system of claim 1, comprising a server having the component, the heat sink, and the at least one blower.

14. The computer system of claim 13, comprising a rack mount computer system including the server.

15. The computer system of claim 1, comprising a plurality of blowers embedded within fins of the heat sink.

16. A heat sink for a computer, comprising:
   an elongated member having a first portion, a second portion adjacent the first portion, and a component mounting surface disposed on a face of the second portion; and
   a plurality of convective members disposed on the first and second portions, wherein the plurality of convective members extend outwardly from the elongated member to at least first and second levels, the second level being higher than the first level, wherein the plurality of convective members at the first level are adapted to receive at least one blower, wherein the at least one blower is configured to intake air in a first direction and output air in a second direction generally transverse to the first direction.

17. The heat sink of claim 16, wherein a portion of the convective members is configured to feed air to an inlet of the at least one blower and another portion of the convective members is configured to receive air from an exit of the at least one blower.

18. The heat sink of claim 16, wherein the plurality of convective members comprise fins that are oriented parallel and lengthwise along the elongated member.

19. The heat sink of claim 16, comprising at least one blower mounting region that is recessed within the plurality of convective members from the second level to the first level.

20. The heat sink of claim 16, wherein the plurality of convective members extending to the first level are disposed on the first portion, and the plurality of convective members extending to the second level are disposed on the second portion.

21. The heat sink of claim 16, wherein the plurality of convective members are disposed on opposite faces of the first portion.

22. The heat sink of claim 16, further comprising the at least one blower, the at least one blower having a base opening and a side opening, the base opening facing the plurality of convective members at the first level and the side opening facing the plurality of convective members at the second level.

23. A method of operating an electronic device, comprising:
   transferring heat from an electronic component along an elongated member disposed across and extended away from the electronic component;
   transferring heat from the elongated member through convective members to first and second levels; and
   forcing an airflow through the convective members and lengthwise along the elongated member from at least one blower disposed substantially between the first and second levels, wherein forcing the airflow comprises pulling air in a first direction from a portion of the convective members into the at least one blower and pushing the air in a second direction from the at least one blower into another portion of the convective members, wherein the second direction is crosswise to the first direction.

24. The method of claim 23, wherein transferring heat from the electronic component comprises conducting heat away from a plurality of processors.

25. The method of claim 23, wherein transferring heat comprises transferring heat through at least one circulating vapor chamber extending along the elongated member.

26. The method of claim 23, wherein transferring heat from the elongated member through convective members comprises dissipating heat through convective members disposed on opposite faces of the elongated member.

27. The method of claim 23, wherein forcing the airflow comprises blowing air through bottom and side openings of the at least one blower, the bottom opening facing the convective members at the first level and the side opening facing the convective members at the second level.

28. The method of claim 23, wherein forcing the airflow through the convective members comprises channeling the airflow between a plurality of fins.

29. A electronic device, comprising:
   means for transferring heat from an electronic component along an elongated member disposed across and extended away from the electronic component;

means for transferring heat from the elongated member through convective members to first and second levels; and means for forcing an airflow through the convective members and lengthwise along the elongated member from at least one blower region substantially between the first and second levels, wherein the means for forcing air is configured to intake air in a first direction and output air in a second direction generally transverse to the first direction.

30. A method of manufacturing an electronic device, comprising:

providing a heat sink comprising an elongated member having a first portion, a second portion adjacent the first portion, and a component mounting surface disposed on a side of the second portion, the heat sink further comprising a plurality of convective members extending from the elongated member to at least first and second levels, the plurality of convective members adapted to support at least one blower substantially between the first and second levels, wherein the at least one blower is configured to intake air in a first direction and output air in a second direction generally transverse to the first direction.

31. The method of claim 30, comprising providing the at least one blower in a position to intake air from a portion of the convective members and to exhaust air into another portion of the convective members.

32. The method of claim 30, comprising embedding the at least one blower within a blower receptacle in the plurality of convective members between the first and second levels.

33. The method of claim 30, comprising mounting the heat sink to position the component mounting surface against a mating surface of at least one electronic component.

34. The method of claim 30, comprising assembling components of the electronic device, the components including the heat sink and the at least one blower.

35. The method of claim 30, wherein providing the heat sink comprises providing at least one circulating vapor chamber along the elongated member.

36. A computer system, comprising:

an electronic component;

a heat sink having a contact surface disposed against the electronic component, wherein the heat sink comprises at least one chamber having a fluid that vaporizes to absorb heat at one region and that condenses to release heat at another region away from the first region; and at least one blower embedded within fins of the heat sink.

* * * * *